United States Patent [19]
Ahmad et al.

[11] Patent Number: 5,427,983
[45] Date of Patent: Jun. 27, 1995

[54] PROCESS FOR CORROSION FREE MULTI-LAYER METAL CONDUCTORS

[75] Inventors: Umar M. U. Ahmad; Harsaran S. Bhatia, both of Hopewell Junction; Satya P. S. Bhatia, Wappingers Falls; Hormazdyar M. Dalal, Milton; William H. Price, Courtland Manor; Sampath Purushothaman, Yorktown Heights, all of N.Y.

[73] Assignee: International Business Machines Corporation, Armonk, N.Y.

[21] Appl. No.: 997,827

[22] Filed: Dec. 29, 1992

[51] Int. Cl.⁶ ............................................. H01L 21/44
[52] U.S. Cl. ............................ 437/192; 148/DIG. 105
[58] Field of Search ............................ 437/192, 981; 148/DIG. 105, DIG. 106

[56] References Cited

U.S. PATENT DOCUMENTS

| | | | |
|---|---|---|---|
| 3,721,841 | 3/1973 | Wilson | 437/192 |
| 4,077,854 | 3/1978 | Estep et al. | |
| 4,309,460 | 1/1982 | Singh et al. | |
| 4,355,456 | 11/1982 | Harnagel et al. | 437/190 |
| 4,396,900 | 8/1983 | Hall | |
| 4,830,723 | 5/1989 | Galvagni et al. | |
| 4,835,593 | 5/1989 | Arnold et al. | |
| 5,019,531 | 5/1991 | Awaya et al. | 437/180 |
| 5,047,832 | 9/1991 | Tonai | |
| 5,139,610 | 8/1992 | Dunaway et al. | 156/656 |
| 5,232,872 | 8/1993 | Ohba | 437/192 |
| 5,266,522 | 11/1993 | Digiacomo et al. | 437/192 |

FOREIGN PATENT DOCUMENTS

| | | |
|---|---|---|
| 0054641 | 10/1981 | European Pat. Off. |
| 0215557 | 7/1986 | European Pat. Off. |
| 2546871 | 4/1977 | Germany |
| 3029277 | 3/1982 | Germany |
| 55-15235 | 7/1978 | Japan |
| 8101079 | 4/1981 | WIPO |

OTHER PUBLICATIONS

Movchan et al. "Study of the Structure and Properties of Thick Vacuum Condensates . . . " Fiz. Metal Metalloved, vol. 28 No. 4, pp. 653–660, 1969.

Grovenor et al. "The Development of Grain Structure During Growth of Metallic Films", Acta Metall. vol. 32, No. 5, pp. 773–781, 1984.

Chisholm et al. "Low Energy Interfaces in Thin Film Structures", Transtech Publications, 1988, p. 201.

*Primary Examiner*—Olik Chaudhuri
*Assistant Examiner*—C. Everhart
*Attorney, Agent, or Firm*—Whitham, Curtis, Whitham & McGinn; Aziz M. Ahsan

[57] ABSTRACT

A thin-layer metallization structure in which the final gold layer is deposited by evaporation with the surface onto which it is evaporated maintained at an elevated temperature. By evaporating the uppermost gold layer of the structure at an elevated substrate temperature, the gold atoms have a higher mobility, causing the deposited gold to spread over the edge of the structure and cover the otherwise exposed edges, including the edge at the copper interface.

12 Claims, 3 Drawing Sheets

APPROX. 200°C

APPROX. 150°C

150°C → COOL → 100°C

HEAT 200°C

PROCESS FOR CORROSION FREE MULTI-LAYER METAL CONDUCTORS

BACKGROUND OF THE INVENTION

1. Field of the Invention

The present invention relates to an improved method for forming a multi-layer, thin-film, metallic structures; more particularly to a structure that resists failure due to corrosion.

2. Description of the Prior Art

In the micro-electronics art, multi-layered, thin-film, metallic structures carry electrical signal and electrical power in a variety of applications, including but not limited to, attaching input/output pins to multi-layer ceramic modules in order to connect these pins to capture pads on the surface of the module. Corrosion is a problem with such multi-layer thin-film conductive structures particularly those structures that include copper. When such a multi-layer metal structure, even one insulated or separated by polyimides, is left exposed to the atmosphere, copper starts to diffuse. It will diffuse into a polyimide or other insulator where the copper reacts to form various oxides, and dendrites tend to grow in the insulator. These dendrites ultimately short out and corrosion occurs.

FIG. 1a illustrates one example of a prior art multi-layer structure of Cr/Cu/Ti/Au on a ceramic or a glass ceramic substrate. Here, copper from the conductive line and the pad react with a polyimide insulator and short out in the insulator by a dendritic corrosion mechanism. This takes place because gold, which is the top layer does not offer any protection to the layers underneath as it does not flow over the underlying metal deposits. Other multi-layer conductors exhibit similar corrosion characteristics. These include multi-layer structures of Cr-Cu-Ni-Au and Cr-Cu-Al-Au.

FIGS. 1b and 1c illustrate another prior art multi-layered thin-film structure of the type to which the teachings of this invention apply. Here, a capture pad 10 is formed by a suitable prior process on the surface of a multi-layer, ceramic module substrate 12. The capture pad 10 is itself a multi-layer metallic structure comprised of layers of chromium-copper-chromium.

After the capture pads are formed, a cushion layer of an insulating polymer, 12', typically a polyimide, is applied and cured over the entire area. Openings are then created in this polymer layer using a laser ablation process or a plasma or reactive ion etching process to expose contact bands on the capture pads. The purpose of the polymer layer is two fold. First, it is used to isolate the pin attachment stresses from the ceramic substrate, and second, it serves as a passivation coating to protect the capture pads.

At this juncture, the thin-film metallic bonding pad structure starts with a thin adhesion layer 11 of a suitable metal such as chromium. A relatively thick (e.g., approximately 6 $\mu$m) stress reducing layer 13 of a soft metal such as copper is formed over the adhesion layer. To prevent the soft copper metal from reacting with a gold-tin eutectic alloy to be used subsequently to braze a pin to the structure, a reaction barrier layer 15 of titanium is then deposited over the stress reducing copper layer. The prior art process is completed by depositing a gold layer 17 over the reaction barrier layer. FIG. 1b illustrates this prior art structure prior to pin brazing. Here, it should be noted that the upper gold layer does not flow over the edge of the chromium, copper, titanium layers so that the edges of these layers are exposed. FIG. 1c indicates the structure of FIG. 1b generally by the reference number 18. In FIG. 1c a conductive pin 14 has been brazed to the structure 18 with a gold-tin braze. Here it should be noted that the brazing material 20 does not wet, and therefore, does not cover the edge of the Cr-Cu-Ti-Au structure 18.

Additional information with respect to prior art structures of the type shown in FIGS. 1b and 1c may be found in U.S. Pat. No. 4,835,593 entitled "Multilayer Thin Film Metallurgy for Pin Brazing", assigned to the assignee of this application and incorporated herein by reference.

While generally satisfactory, the prior art structures of the type described in connection with FIG. 1 are susceptible to corrosion and eventual failure during operation. One prior art approach to prevent corrosion is to coat the entire substrate surface with a polyimide coating. While generally satisfactory, the polyimide coating can randomly coat the contact surfaces, resulting in an insulated contact.

SUMMARY OF THE INVENTION

An object of this invention is the provision of an improved method for forming a multi-layer conductive structure of the types described in connection with FIG. 1; a method that results in a structure that resists corrosion and eliminates the need for a polyimide or other similar corrosion resistant overcoating.

Briefly, this invention contemplates a process for forming a thin-film metallization pad structure of the type described in which the final gold layer is deposited by evaporation with the surface onto which it is evaporated maintained at an elevated temperature. As previously mentioned, applicants have identified that the problem of corrosion in the prior art structures takes place at the exposed edges. By evaporating the uppermost gold layer of the structure onto a substrate maintained at an elevated temperature, the gold atoms during deposition have a high mobility, causing the deposited gold to spread over the edge of the structure and cover the otherwise exposed edges. When, for example, a pin is brazed to the multi-layer structure, the gold-tin brazing material flows wherever the gold has spread, thereby providing an additional covering.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF A PREFERRED EMBODIMENT OF THE INVENTION

Figure 2A:
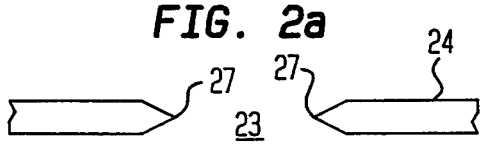
FIGS. 2a through 2d illustrate the steps of one embodiment of a process for forming a thin-film, multi-layer structure in accordance with the teachings of this invention.

Referring now to FIG. 2a, in one specific embodiment of the invention, a thin-film metallization pad structure in accordance with the invention is deposited onto a substrate through opening 23 on a metal mask 24. The substrate 12, in this example, is a ceramic or glass-ceramic substrate. In this particular example, a molybdenum mask 24 is used with an opening 23 formed by electroetching, preferably a two-sided etch to form knife-shaped edges 27, as this enhances the spreading of the metal being evaporated. The mask and the substrate 12 are aligned and held in place by a suitable fixture (not shown).

It will be appreciated that there is a mismatch in the thermal coefficients of expansion between the metal mask 24 and the substrate 12. The optimum temperature range of the substrate to deposit a gold layer in order to achieve the desired spreading in accordance with this invention is between 130° C. and 200° C. To reduce the effects of the thermal coefficient mismatch between the mask and the substrate, the process steps other than the gold deposit step are carried out at relatively low substrate temperatures, i.e., between 80° C. and 150° C. It should be noted that the spreading of the gold layer can be enhanced by a combination of the relatively higher substrate temperature, the metal mask, and the knife edges.

The assembly of mask 24 and substrate 12 are placed in an appropriate evaporation system (not shown) which is pumped down to about $10^{-6}$ torr and heated to about 200° centigrade for 15 to 30 minutes in order to outgas the assembly. The surface exposed through the mask is then cleaned in situ using argon to ensure removal of all absorbed contaminants from the ceramic areas exposed through the mask. A radio frequency, argon plasma at 1 to 5 m torr or alternatively argon ions from a broad beam ion source are each satisfactory processes for this cleaning step. FIG. 2a illustrates the assembly at the completion of these steps in the process.

Figure 2B:
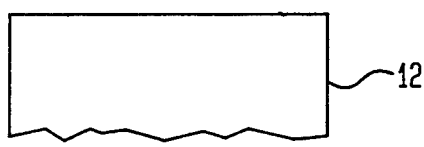

The substrate is then heated to 150° centigrade and an adhesion layer such as 200 Å layer 11 of chromium is deposited by evaporation of chromium onto the surface of the substrate exposed through the opening 23 in the mask. The substrate temperature is maintained at about 150° C. throughout this process step in order to form a chromium film with good adhesion of the film to the substrate surface and a low stress between the film and the surface. FIG. 2b shows the process at this step.

Figure 2C:
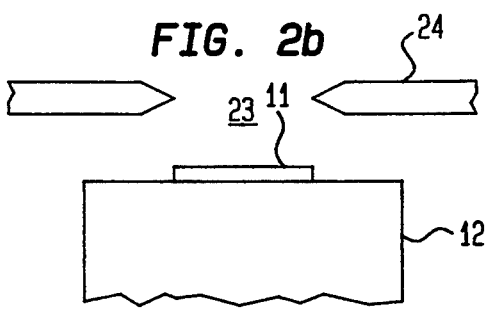
Figure 2D:
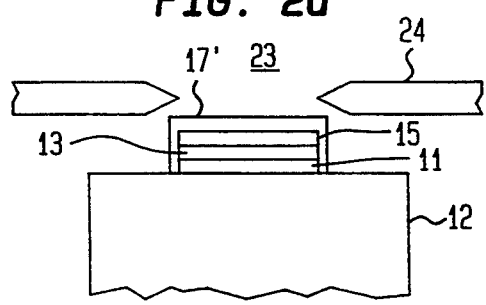

Next, a cushion layer such as copper and a diffusion barrier layer such as titanium are deposited sequentially by a suitable prior art evaporative process through the opening 23 in the mask 24 as the substrate cools from an initial temperature of the proceeding step (150° centigrade) to about 100° centigrade. The copper layer 13 is about 60 kÅ thick and the titanium layer 15 is about 10 kÅ thick. FIG. 2c shows the assembly at this process step.

After the deposition of the copper and titanium layers 13 and 15 respectively, the substrate is reheated to 200° centigrade and a gold layer 17' about 10 kÅ thick is deposited by evaporation through the opening 23 in the mask 24 onto the previously deposited layers. The heat is then turned off and the assembly allowed to cool to 50° centigrade or less, followed by venting of the chamber with dry nitrogen to atmospheric pressure to allow unloading of the assembly from the chamber.

Figure 3:
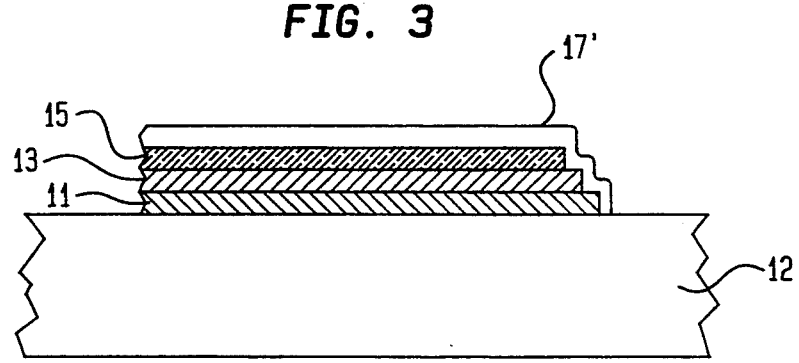
FIG. 3 is a sectional view of thin-film structures constructed in accordance with the teachings of this invention.

FIG. 3 shows the completed structure. Depositing the gold layer at an elevated substrate temperature increases the mobility of the gold atoms which diffuse down over the edges of the previously formed layers, so that the gold layer 17' encapsulates the underlying multi-layer structure as illustrated in FIG. 3. This gold covering 17' prevents oxidation and diffusion of copper and thus prevents corrosion.

The third metallic diffusion barrier layer 15 is a metal selected from a group consisting of Titanium (Ti), Nickel (Ni), Cobalt (Co), Platinum (Pt) or Palladium (Pd).

Figure 1A:
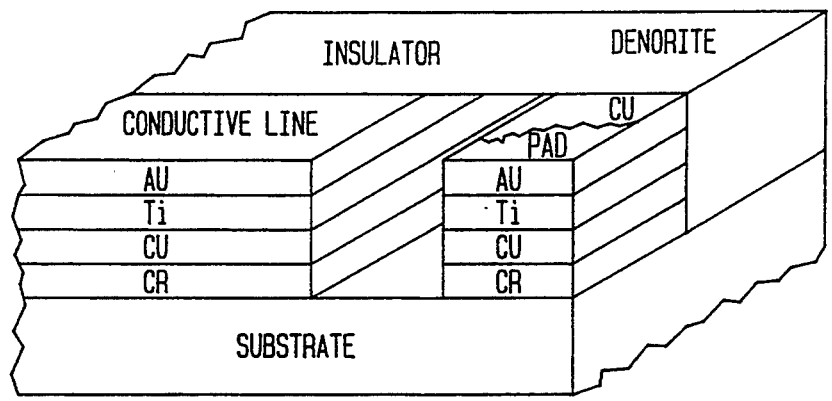
FIGS. 1a, 1b and 1c are sectional views (not to scale) of thin-film metal structures formed in accordance with prior art processes, and used here to explain the problem that applicants have identified.
Figure 4A:
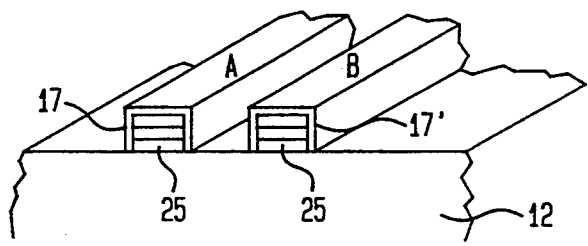
FIGS. 4a and 4b are sectional views, similar to those shown in FIG. 1a, but with thin-film metal structure in accordance with the teachings of this invention.
Figure 4B:
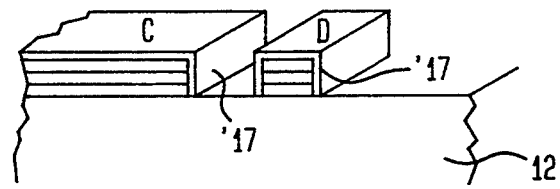

As will be readily apparent to those skilled in the micro-electronics art, the process steps described in connection with FIG. 2 can be used to form multi-layer conductive line structures and multi-layer pad structures. FIG. 4a illustrates two adjacent line structures A and B, each with a multi-layer structure 25, such as Cr-Cu-Ti or Cr-Cu-Ni or Cr-Cu-Al, each encapsulated by a gold layer 17' deposited at an elevated substrate temperature in accordance with the invention. FIG. 4b shows a similar line-pad structure.

Figure 5:
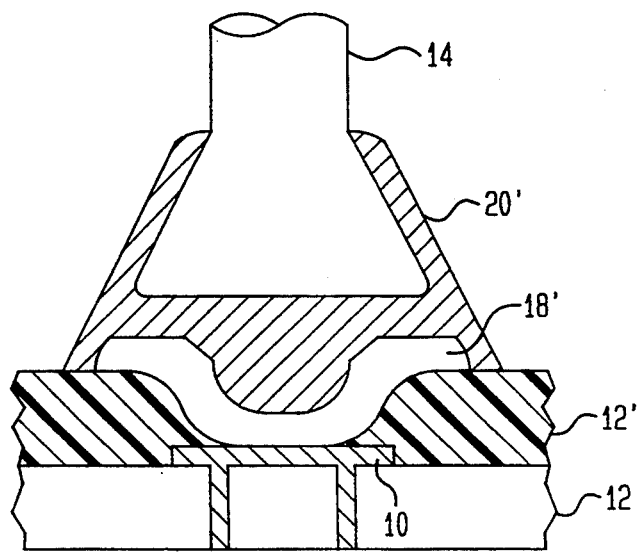
FIG. 5 is a sectional view similar to FIG. 1c but with a structure in accordance with the teaching of this invention.
Figure 1B:
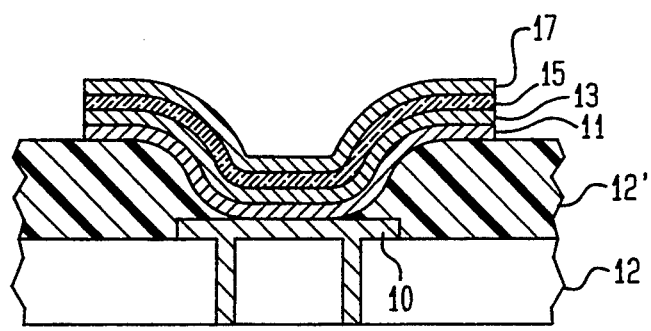
Figure 1C:
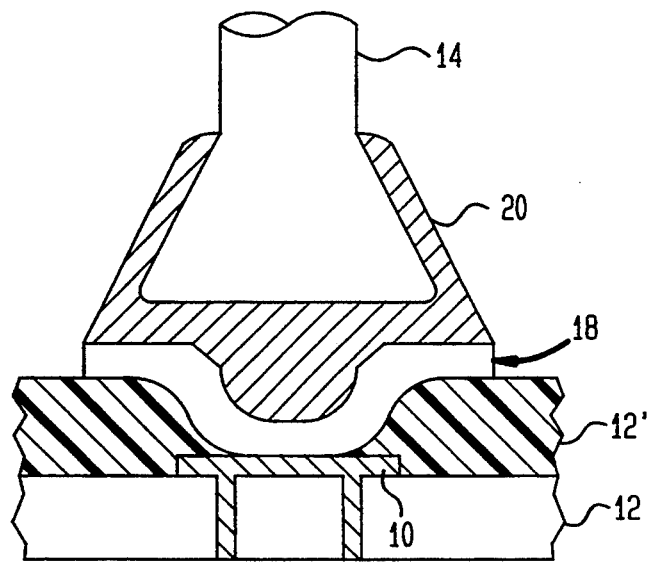

FIG. 5 shows a pin structure of the type shown in FIG. 1c, but with a gold layer formed at an elevated substrate temperature so that it encapsulates the underlying multi-layer structure. Here it should be noted when the pin 14 is brazed to the structure, the gold-tin brazing material 20' completely covers the edges of the structure as shown in FIG. 5, providing further edge protection to the gold covered structure 18'.

It will be appreciated that the invention is applicable to multi-layer metallic structures on substrates other than those specifically described. Other suitable materials for adhesion layer 11 are Ti, Zr, Nb, Mo, Ta, W, Hf, and V. Similarly, the second metal layer 15 could, in place of the copper layer discussed, be an aluminum layer or a layer of a copper alloy or aluminum alloy.

While the invention has been described in terms of a single preferred embodiment, those skilled in the art will recognize that the invention can be practiced with modification within the spirit and scope of the appended claims.

Having thus described our invention, what we claim as new and desire to secure by Letters Patent is as follows:

1. A method of forming a corrosion resistant multi-layer, metal structure on a substrate comprising the steps of:

depositing a first metallic layer through an opening in a mask onto said substrate;

depositing a second metallic layer through said mask opening onto said first metallic layer; and depositing gold through said mask opening to cover the said first and second metallic layers while maintaining said substrate at a temperature in a range between 130° and 200° C.

2. A method of forming a corrosion resistant multi-layer, metal structure on a substrate comprising the steps of:

depositing an adhesion metallic layer through an opening in a mask onto said substrate;

depositing a cushion metallic layer through said mask opening onto said adhesion metallic layer;

depositing a reaction barrier metallic layer through said opening onto said cushion metal layer; and depositing gold through said mask opening to cover the said metallic layers while maintaining said substrate at a temperature in a range between 130° and 200° C.

3. A method of forming a corrosion resistant multilayer metal structure as in claim 2, wherein said mask is made of molybdenum.

4. A method of forming a corrosion resistant multilayer metal structure as in claim 3, wherein said mask tapers to form a knife edge that defines said opening.

5. A method of forming a corrosion resistant multilayer metal structure as in claim 2, wherein said metallic layers are each deposited at a temperature in a range between 80° C. and 150° C.

6. A method of forming a corrosion resistant, multilayer metal structure as in claim 2, wherein said adhesion layer is selected from a group consisting of Cr, Ti, Zr, Nb, Mo, Ta, W, Hf, and V, and alloys of Cr, Ti, Zr, Nb, Mo, Ta, W, Hf, and V.

7. A method of forming a corrosion resistant, multilayer metal structure as in claim 2, wherein said cushion metallic layer is selected from the group consisting of Cu, Al, and alloys of Cu and Al.

8. A method of forming a corrosion resistant, multilayer metal structure as in claim 6, wherein said cushion metallic layer is selected from the group consisting of Cu, Al, and alloys of Cu and Al.

9. A method of forming a corrosion resistant, multilayer metal structure as in claim 2, wherein said reaction barrier metallic layer is selected from the group consisting of Ti, Ni, Co, Pt, and Pd, and alloys of Ti, Ni, Co, Pt, and Pd.

10. A method of forming a corrosion resistant, multilayer structure as in claim 6, wherein said reaction barrier metallic layer is selected from the group consisting of Ti, Ni, Co, Pt, and Pd, and alloys of Ti, Ni, Co, Pt, and Pd.

11. A method of forming a corrosion resistant, multilayer metal structure as in claim 8, wherein said reaction barrier metallic layer is selected from the group consisting of Ti, Ni, Co, Pt, and Pd, and alloys of Ti, Ni, Co, Pt, and Pd.

12. A method of forming a corrosion resistant multilayer, metal structure on a substrate as in claim 1, wherein said first metallic layer is an adhesion layer selected from a group consisting of Cr, Ti, Zr, Nb, Mo, Ta, W, Hf, and V, and alloys of Cr, Ti, Zr, Nb, Mo, Ta, W, Hf, and V, and said second metallic layer is a cushion layer selected from the group consisting of Cu, Al, and alloys of Cu and Al.

* * * * *